US008330588B2

(12) United States Patent
Dixit et al.

(10) Patent No.: US 8,330,588 B2
(45) Date of Patent: Dec. 11, 2012

(54) FAST REPEATER LATCH

(75) Inventors: Anand Dixit, Mountain View, CA (US); Robert P. Maisleid, Monte Sereno, CA (US)

(73) Assignee: Oracle International Corporation, Redwood City, CA (US)

( * ) Notice: Subject to any disclaimer, the term of this patent is extended or adjusted under 35 U.S.C. 154(b) by 420 days.

(21) Appl. No.: 12/759,833

(22) Filed: Apr. 14, 2010

(65) Prior Publication Data

US 2011/0254669 A1 Oct. 20, 2011

(51) Int. Cl.
*G08B 1/00* (2006.01)
*H03L 7/00* (2006.01)
(52) U.S. Cl. ........ 340/309.9; 326/27; 327/161; 327/212
(58) Field of Classification Search ............... 340/309.9; 326/23, 27, 86; 327/112, 161, 117, 212
See application file for complete search history.

(56) References Cited

U.S. PATENT DOCUMENTS

| 6,426,652 | B1 | 7/2002 | Greenhill |
| 7,071,747 | B1 | 7/2006 | Masleid |
| 7,119,580 | B2 | 10/2006 | Masleid |
| 7,256,634 | B2 | 8/2007 | Masleid |
| 7,592,839 | B2 | 9/2009 | Masleid |
| 7,595,664 | B1 | 9/2009 | Masleid |
| 8,063,673 | B2 * | 11/2011 | Masleid ........................ 327/112 |

* cited by examiner

*Primary Examiner* — John A Tweel, Jr.
(74) *Attorney, Agent, or Firm* — Meyertons, Hood, Kivlin, Kowert & Goetzel, P.C.; Erik A. Heter

(57) ABSTRACT

A repeater circuit is disclosed. The repeater circuit includes an input circuit coupled to receive a data input signal and a clock signal, and an output circuit configured to, when activated, drive an output signal on an output node. The input circuit is further configured to activate the output circuit in order to initiate a logical transition of the data output signal. A deactivation circuit is configured to deactivate the output circuit at a delay subsequent to activation. A latch is coupled to the output circuit and it is configured to change a latch output state responsive to activation of the output circuit. The latch is configured to hold a state of the output node subsequent to deactivation of the output circuit. The input circuit is configured to activate the output circuit dependent on the clock signal. The deactivation circuit is configured to deactivate the output circuit independent of the clock signal.

20 Claims, 8 Drawing Sheets

FAST REPEATER LATCH

BACKGROUND

1. Field of the Invention

This invention relates to electronic circuits, and more particularly, to repeater circuits.

2. Description of the Related Art

As integrated circuit (IC) technology advances, the speed at which IC's operate increases while operating voltages generally decrease. As such, the distance at which signals must propagate on a die become an increasingly important factor to consider in IC design. At longer distances, on-die interconnects between a transmitter and a receiver can develop enough resistance and enough capacitance that the signal transition at the receiver can be adversely affected. Excessive propagation delay across a long signal interconnect can affect the transition at the receiver in terms of both timing and voltage levels. For example, a signal that propagates too slowly across an interconnect may in some cases not allow sufficient set-up and hold time for the receiver to properly transition from one logic level to another. Furthermore, a slow transition can cause crowbar currents in some receivers, which can lead to increased power consumption and may further lead to circuit damage in more severe cases.

In order to combat the negative effects of long signal interconnects, repeater circuits may be implemented. More particularly, repeater circuits may be placed along a signal path between a transmitter and receiver, effectively breaking a single interconnect into two or more interconnects. In such a configuration, repeater circuits may overcome some of the problems of resistance and capacitance that would be present in a single signal interconnect, and may further cause faster transition times at the receiver.

Repeater circuits may be simple or complex. The simplest interconnect circuits may be implemented using an inverter, with a double inverter (i.e. a buffer) being an alternative if no logical inversion is desired. FIG. 1 is a schematic diagram of a more complex repeater circuit. In the embodiment shown, repeater circuit 200 may change the state of a signal on its output node ('Out') responsive to a change on its input node ('In'). The input signal may propagate through weak keeper 205 to the output node. The output signal may also be driven on the output node by output circuit 225. For example, if the input signal transitions from a low to a high, transistor N201 is activated, and a pull-down path is provided between node dp and ground through N201 and N202. As a result, P203 is activated and drives the output node high. After a delay time determined equal to the propagation delay through delay circuit 210, transistor N202 may be deactivated while transistor P202 is activated, pulling node dp high. A high-to-low transition of the input signal may occur in a similar manner, with N206 driving the output node low until turned off via the feedback path through delay circuit 210.

The use of repeater circuit 200 may provide certain advantages over simpler repeater circuits, such as the aforementioned buffers and inverters. For example, repeater circuit 200 may be less susceptible to crowbar currents than a buffer or an inverter. Furthermore, power consumption may be reduced, since the two output devices (which are typically much larger than other devices in the circuit) are not active at the same time, thereby preventing crowbar power consumption. Instead, the output devices may provide sufficient drive to overcome the resistance and capacitance inherent in the signal interconnect long enough to enable a timely transition at the receiver, and then turned off once the output is present on the output of weak keeper 205.

In some cases, the length of a signal path between two points on an IC die may have a propagation time that is longer than a clock cycle at which the IC operates. Accordingly, it may be necessary to store the state of the transmitted signal across a clock boundary. One solution for such a situation is to use a flip-flop, rather than using a repeater circuit.

SUMMARY OF THE DISCLOSURE

A repeater latch circuit is disclosed. In one embodiment, the repeater latch circuit includes an input circuit coupled to receive a data input signal and a clock signal and an output circuit coupled to the input circuit, wherein the output circuit is configured to, when activated, drive an output signal on an output node. The input circuit is further configured to, responsive to a logical transition of the input signal, activate the output circuit in order to initiate a logical transition of the data output signal. The repeater circuit may also include a deactivation circuit configured to deactivate the output circuit at a delay time subsequent to activation of the output circuit, and a latch coupled the output circuit, wherein the latch circuit is configured to change a latch output state responsive to activation of the output circuit, and wherein the latch is further configured to hold a state of the output circuit on the output node subsequent to deactivation of the output circuit. The input circuit may be configured to activate the output circuit dependent on the clock signal, and wherein the deactivation circuit is configured to deactivate the output circuit independent of the clock signal.

In one embodiment, the repeater latch circuit includes an output circuit having a first transistor and a second transistor and configured to drive an output signal onto an output node, wherein the first transistor is configured to drive the output signal when a first node is active, and wherein the second transistor is configured to drive the output signal when a second node is active. The repeater latch may also include an input circuit coupled to the first node and the second node and further coupled to receive an input signal and a clock signal, wherein the input circuit is configured to activate the first node responsive to first logical transition of the input signal concurrent with a first state of the clock signal, and further configured to activate the second node responsive to a second logical transition of the input signal concurrent with the first state of the clock signal. A deactivation circuit may be configured to, independent of the clock signal, deactivate an active one of the first and second nodes at a delay time subsequent to activation of one of the first and second nodes. The repeater latch circuit may also include a latch having first and second inputs coupled to the first and second nodes, respectively, and configured to change a latch output state responsive to activation of one of the first and second nodes, and wherein the latch is further configured to maintain a state of the output signal subsequent to deactivation of the one of the first and second nodes.

BRIEF DESCRIPTION OF THE DRAWINGS

Other aspects of the invention will become apparent upon reading the following detailed description and upon reference to the accompanying drawings in which.

Figure 1:
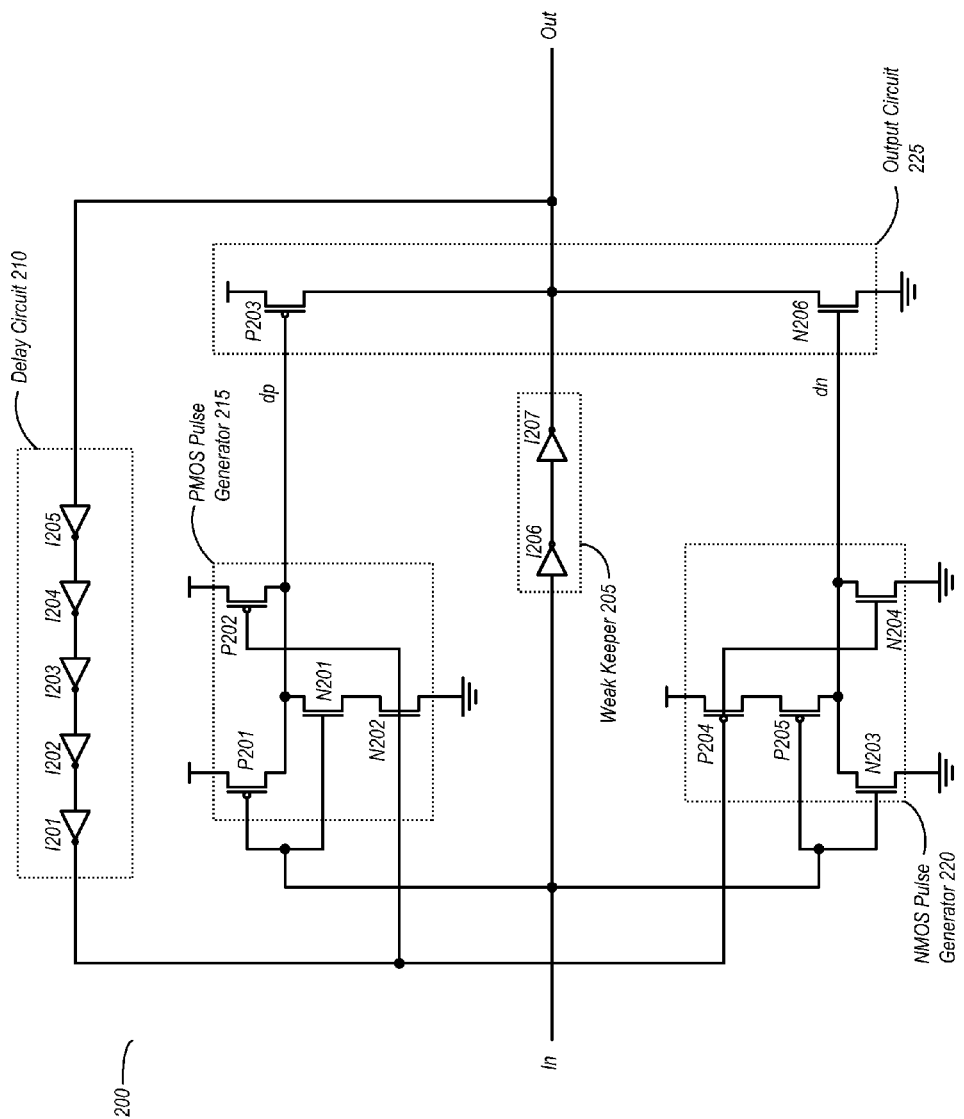
FIG. 1 (Prior Art) is a schematic diagram of one embodiment of a repeater circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Figure 2:
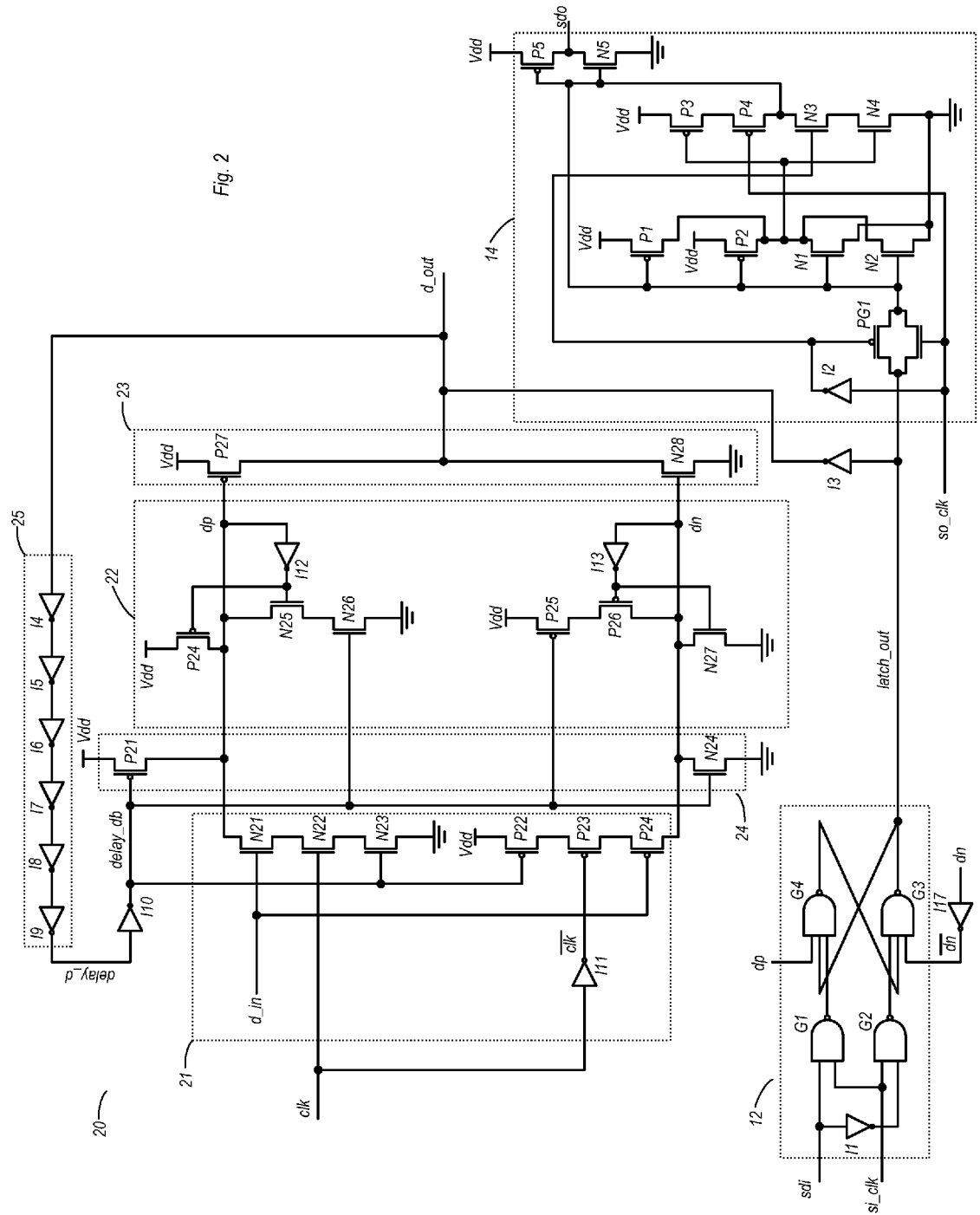
FIG. 2 is a schematic diagram of one embodiment of a repeater latch circuit.

Repeater Latch Embodiments:

Turning now to FIG. 2, a schematic diagram of one embodiment of a repeater latch circuit is shown. In the embodiment shown, repeater latch 20 includes an input circuit 21, an output circuit 23, a keeper circuit 22, a feedback loop that includes delay circuit 25, deactivation circuit 24, latch 12, and scan output latch 14. Repeater latch 20 may be utilized in a signal path of an integrated circuit (IC) where the use of a repeater circuit may be necessary or desirable. A data input signal may be received on the data input node ('d_in'), and may be conveyed from repeater latch circuit 20 via a data output node ('d_out'). Utilizing latch 12 and scan output latch 14, repeater latch 20 may also be tested during scan testing of an IC in which it is implemented.

It is noted that in the various embodiments discussed herein, NMOS (n-channel metal oxide semiconductor) transistors are designated with an 'N' (e.g., N21, N22, etc.). Similarly, PMOS (p-channel metal oxide semiconductor) transistors are designated with a 'P' (e.g., P21, P22, etc.).

In the embodiment shown, input circuit 21 is coupled to receive a data input signal on node d_in, and a clock signal on the clock node ('clk'). The data input and clock signals may be provided to each of a pull-down circuit and a pull-up circuit. The pull-down circuit of input circuit 21 in this embodiment includes transistors N21, N22, and N23. When each of transistors N21, N22, and N23 are simultaneously active, a pull-down path is provided between node dp and ground. The pull-up circuit of input circuit 21 includes transistors P22, P23, and P24. When each of transistors P22, P23, and P24 are simultaneously active, a pull-up path is provided between node do and the voltage supply node Vdd.

Input circuit 21 also includes an inverter I11 in this embodiment, which is coupled to the clock node, and configured to provide a complement of the clock signal to the pull-up circuit. Thus the clock may be high on the gate terminal of transistor N22 while concurrently being low on the gate terminal of transistor P23.

The data input node in the embodiment shown is coupled to respective gate terminals of transistors N21 and P24. Since transistors N21 and P24 are of opposite polarities, only one may be active at a given time, and thus only one of the pull-up or pull-down circuits is active at a given time. The clock node is coupled to a gate terminal of transistor N22, while a complementary clock node (i.e. the output from inverter I11) is coupled to transistor P23. Thus, both transistors N22 and P23 may be active when the clock signal is high, and inactive when the clock signal is low. One of transistors N23 and P22 may be active at a given time, dependent on the state of node delay_db, which will be discussed further below.

Since both N22 and P23 are configured to be activated when the clock signal is in a particular state (high this particular embodiment), repeater latch 20 may thus be referred to as a level sensitive circuit. That is, a change of state of the data input signal (e.g., a low-to-high logical transition) may trigger a change of state of the output signal only if initiated concurrent with the clock signal being in a given state. It is noted that the change of state of the input signal need not be synchronized to an edge (e.g., the rising edge) of the clock signal, and thus may occur either before or after the clock signal transitions. Instead, a logical transition of the output signal may be initiated if the logical transition of the data input signal is concurrent with the clock signal being high in the embodiment shown. Therefore, a logical transition of the output signal may occur if the logical transition of the data input signal occurs before the clock transitions high or after the clock signal transitions high.

If the data input signal transitions from a low to a high concurrent with the clock signal transitioning high, and transistor N23 is turned on (resulting from a logic low on the output node, d_out), then the pull-down circuit activates and node dp is pulled low. If the data input signal transitions from a high to a low concurrent with the clock signal transitioning high, and P22 is active (as a result of a logic high on the output node), then the pull-up circuit is activated and node dn is pulled high.

In the embodiment shown, output circuit 23 may be considered active when one of nodes dp or dn is active. Node dp may be considered active in this embodiment when it is pulled low, while node dn may be considered active when pulled high. When node dp is pulled low by the pull-down circuit of input circuit 21, transistor P27 of output circuit 23 is activated and may thus drive a logic high output signal on the output node. When node dn is pulled high by the pull-up circuit of input circuit 21, transistor N28 is activated and may pull the output node low. It is noted that since input circuit 21 is arranged such that only one of the pull-up or pull-down circuits is active at a given time, only one of nodes dp or dn and thus only one of transistors P27 or N28, respectively, is active at the same time. Therefore, contention between transistors P27 and N28 and potential crowbar currents may be avoided.

In the embodiment shown, the output signal is provided to a feedback loop that included delay circuit 25. Delay circuit 25 in this embodiment includes inverters I4-I9, with the output of inverter I9 being a delayed version of the output signal provided on node delay_d. Inverters I4-I9 are coupled together in series, and thus delay time equal to the delay of the series coupled inverters may be provided. The feedback loop in this embodiment also includes inverter I10, which provides, with an additional delay, a delayed complement of the output signal on node delay_db.

Transistors P21 and N24 of deactivation circuit 24 are coupled to receive the delayed complement of the output signal, as are transistors N23 and P22 of input circuit 21. Since transistor P21 and N24 are of opposite polarities, only one may be active at a given time. Similarly, only one of transistors N23 and P22 may be active at a given time due to them having opposite polarities.

If the output node transitions from a logic low to a logic high (resulting from a corresponding logical transition on the data input node), a high-to-low transition may occur on node delay_db at a delay time subsequent to the output node transition. When delay_db falls low, transistor P21 is activated while transistor N23 is deactivated. The activation of transistor P21 may pull node dp high, while the pull-down circuit may be deactivated by the deactivation of transistor N23. Thus, transistor P21 may pull node dp high, without contention from N23, thereby causing P27 to be deactivated. The operation of deactivation circuit 24, and thus the deactivation of transistor P27 may occur independently of the clock signal. Thus, even if the clock signal falls low after input circuit 21 has initiated the logical transition of the output node, the transition may be allowed to complete and deactivation circuit 24 may subsequently deactivate transistor P27, which discontinues driving d_out high thereafter.

If the output node transitions from a logic high to a logic low (resulting from a corresponding transition on the data input node), node delay_db may transition high after a delay. As a result of the low-to-high transition of node delay_db, transistor P22 of input circuit 21 is turned off, while transistor N24 of deactivation circuit 24 is turned on. When transistor P22 is turned off, the pull-up circuit of input circuit 21 is deactivated, thereby removing the pull-up path between node dn and the supply voltage node Vdd. When transistor N24 is turned on, a pull-down path is provided between node dn and ground, thus causing node dn to fall low. When node dn falls low, transistor N28 is deactivated, and thus no longer drives the d_out low.

Repeater latch 20 in the embodiment shown includes keeper circuit 22, which is configured to hold nodes dp and dn in their inactive states subsequent to completing a logical transition of the output node. When transistor P21 is activated responsive to delay_db falling low and thus casing node dp to be pulled high, inverter I12 outputs a low and thereby activates transistor P24, thus providing a second pull-up path for node dp. Similarly, when transistor N24 is activated responsive to node delay_db transitioning high, node dn is pulled low, thereby causing the output of inverter I13 to transition high and thus activate another pull-down path by turning on transistor N27.

Keeper circuit 22 may also aid in the transition of nodes dp and dn from their respective inactive states to their active states responsive to a logical transition on the data input node. If node delay_db is low, transistor P25 is turned on. When a high-to-low transition on the data input node occurs concurrent with the high on the clock input node, each of transistors P22, P23, and P24 may be active, thereby providing a pull-up path between node dn and Vdd. This may in turn cause inverter I13 to output a logic low that activates transistor P26. Thus, when P25 and P26 are both active, a second pull-up path is provided between node dn and Vdd, adding extra drive strength to pull the node high. As previously noted, transistor N28 is turned on when node dn is pulled high. Transistor P25 may be subsequently turned off, after a delay time, when delay_db transitions from low to high responsive to the high-to-low transition of d_out. Transistor P22 may also be turned off responsive to the low-to-high transition of delay_db, thus closing off the other pull-up path between node dn and Vdd. The transition from low to high on delay_db may also activate transistor N24, which may then pull dn low when both pull-up paths are inactive.

When node delay_db is high, transistor N26 is active in the embodiment shown. When a low-to-high transition occurs on the data input node concurrent with a high on the clock input node, transistors N21, N22, and N23 may be activated to provide a pull-down path between node dp and ground. As dp is pulled low, the output of inverter I12 transitions from low to high, thereby activating transistor N25. When transistors N25 and N26 are both active, a second pull-down path is provided between node dp and ground. Transistor P27 may then turn on and drive d_out high once the level on node dp falls sufficiently low due to one or both of the pull-down paths. These pull-down paths may remain active until node delay_db falls low at a delay time subsequent to d_out transitioning high. When delay_db falls low, transistors N26 of keeper circuit 22 and N23 of input circuit 21 are both turned off. Both pull-down paths are then deactivated, and node dp is pulled up responsive to the activation of transistor P21.

Latch 12 in the embodiment shown is an SR (set-reset) latch. In the embodiment shown, latch 12 includes two 2-input NAND gates, G1 and G2, and two 3-input NAND gates, G3 and G4. Gates G1 and G2 may be coupled to receive inputs for scan testing. More particularly, gate G1 may receive a scan data input ('sdi') and a scan input clock ('si_clk'). Gate G2 may also receive the scan input clock, as well as a complement of the scan data input via inverter I1. When not operating in a scan testing mode, the scan input clock may be held low, and thus the outputs of both gates G1 and G2 may be driven high. The outputs from gates G1 and G2 are received as inputs by gates G4 and G3, respectively, in this particular embodiment.

When dp is pulled low, the output of gate G4 may be driven high, thereby causing the output of gate G3 (i.e., 'latch_out') to fall low. The low from G3 may be inverted to a high by inverter I3 and driven to the output node or repeater latch 20, d_out. When dn is pulled high, latch_out may be driven high, and thus the output of I3 may fall low. The output state of inverter I3, whether high or low, may be held even when transistors P27 and N28 are off (and thus are not driving d_out). Accordingly, when not operating in a scan testing mode, latch 12 may serve as a keeper/state element, which stores the data value of the most recently received input logic transition and holds this value on the output node of repeater latch 20.

When the embodiment shown is operating in a scan test mode, the value output on latch_out may be in accordance with scan data input value received on the scan data input when the scan clock signal is high. If a logic high is received at sdi, gate G3 may output a logic low on latch_out. If a logic low is received at sdi, gate G3 may output a logic high on latch_out. In general, latch 12 in this embodiment is arranged to output a logic value on node latch_out that is a complement of the scan data input, when operating in a scan testing mode. It is noted however that circuit arrangements are also possible and contemplated wherein the output of a scannable latch such as latch 12 is logically equal to the scan data input.

Repeater latch 20 also includes scan output latch 14 in the embodiment shown. Scan output latch as shown here includes a passgate PG1, inverter I2, and three additional inverters. The first of these inverters includes transistors P1, P2, N1, and N2. A second one of these inverters in this embodiment is tri-stateable, and includes transistors P3, P4, N3, and N4. The tri-stateable inverter may be enabled when the scan out clock is low, which causes transistors P4 and N3 to be turned on. A third inverter in this embodiment includes transistors P5 and N5, and is arranged to provide the scan data output ('sdo'). Scan output latch 14 includes a data input coupled to the latch_out node, and also includes an input for a scan out clock ('so_clk').

During scan testing operations, the logic value present on latch_out may be latched into scan output when the scan out clock signal is high. When the scan out clock signal is high, passgate PG1 may activate and thus allow the logic value to propagate into latch 14, and to the first inverter comprised of P1, P2, N1, and N2. When the scan out clock falls low, passgate PG1 may deactivate, while transistors P4 and N3 of the second inverter may be turned on. The output signal provided by the second inverter is then dependent on its input value. If the second inverter receives a low, transistors P3 may be turned on, and thus its output is thus pulled high through P3 and P4. If the second inverter receives a low, transistor N4 may be turned on, and thus its output may be pulled low through N3 and N4. This logic value is then conveyed to the third inverter, which outputs the complement of this logic value on the scan data output. It is noted that the logic value provided on the scan data output is the complement of the input value received from latch_out in this embodiment. However, embodiments of scan output latch 14 having an even number of inverters (which thus outputs a logic value equivalent to that received on the input) are also possible and contemplated.

Figure 3:
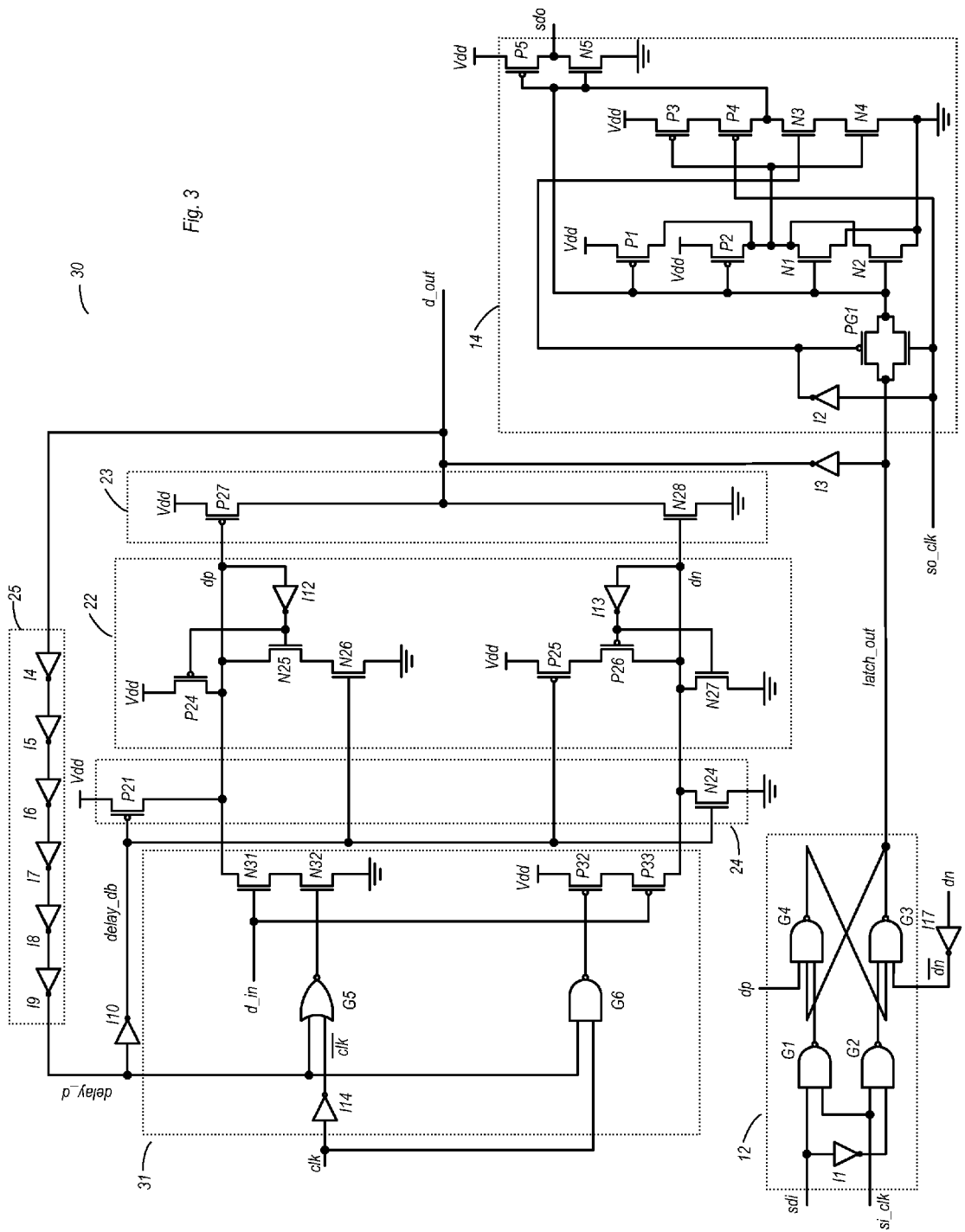
FIG. 3 is a schematic diagram of another embodiment of a repeater latch circuit.

FIG. 3 is a schematic diagram of another embodiment of a repeater latch circuit. In the embodiment shown, repeater latch 30 includes a latch 12, a scan output latch 14, keeper circuit 22, output circuit 23, deactivation circuit 24, and a feedback loop including delay circuit 25, each of which are arranged similarly to those discussed in reference to FIG. 2. However, input circuit 31 of repeater latch 30 differs from input circuit 21 of repeater latch 20. In this particular embodiment, the pull-down circuit of input circuit 31 includes two transistors, N31 and N32, instead of the three-transistor stack in the previously discussed embodiment. Similarly, the pull-up circuit of input circuit 31 includes two transistors, P32 and P33, instead of the three-transistor pull-up stack of the embodiment shown in FIG. 2. Reducing the pull-up and pull-down stacks from three transistors to two may increase the switching speed of the input circuit. Relative to a two-transistor stack, implementation of a three-transistor stack may require that the gate widths of each transistor be increase by approximately 50% to achieve the same resistance as the transistors of the two-transistor stack. This may in turn increase loading on the driving circuits, while body effect may cause a body bias on one or more of the transistors in the three-transistor effect, thereby resulting in slow switching speeds. Accordingly, the embodiment shown in FIG. 3 which utilizes two-transistor stacks may be used in applications wherein emphasis on operational speed is at a premium.

In order to implement input circuit 31 utilizing two-transistor stacks for the pull-up and pull-down circuits, NOR gate G5 and NAND gate G6 are provided. NOR gate G5 in the embodiment shown is coupled to receive the complement of the clock signal and a delayed version of the output signal via node delay_d. NOR gate G5 may output a logic high signal when the clock is high (and thus its complement is low) and when a logic low is also present node delay_d. When a logic high is output from NOR gate G5, transistor N32 is activated. If a low-to-high transition occurs on d_in concurrent with a high output provided by NOR gate G5, transistors N31 and N32 may both active at the same time, thereby pulling node dp low. Transistor P27 may thus turn on and pull d_out high until the high output signal propagates to node delay_d and causes NOR gate G5 to output a logic low. When NOR gate G5 outputs a logic low, transistor N32 is turned off and the pull-down path is deactivated. Node delay_db may also transition high at this time, turning on transistor P21, thus pulling node dp high and deactivating transistor P27.

NAND gate G6 in the embodiment shown is configured to output a logic low when both the clock signal and the logic value on node delay_d are high. When the output of NAND gate G6 is low, transistor P32 may be activated. If a high-to-low transition occurs on node d_in when P32 is active, P33 is also activated and thus node dn is pulled high. Transistor N28 may then be activated, pulling the node d_out low. Transistor N28 may remain active until the low provided on d_out propagates through delay circuit 25 and inverter I10, which may cause NAND gate G6 to output a logic high (due to delay_d falling low) and N24 to turn on and pull node dn low (due to delay_db transitioning high).

Figure 4:
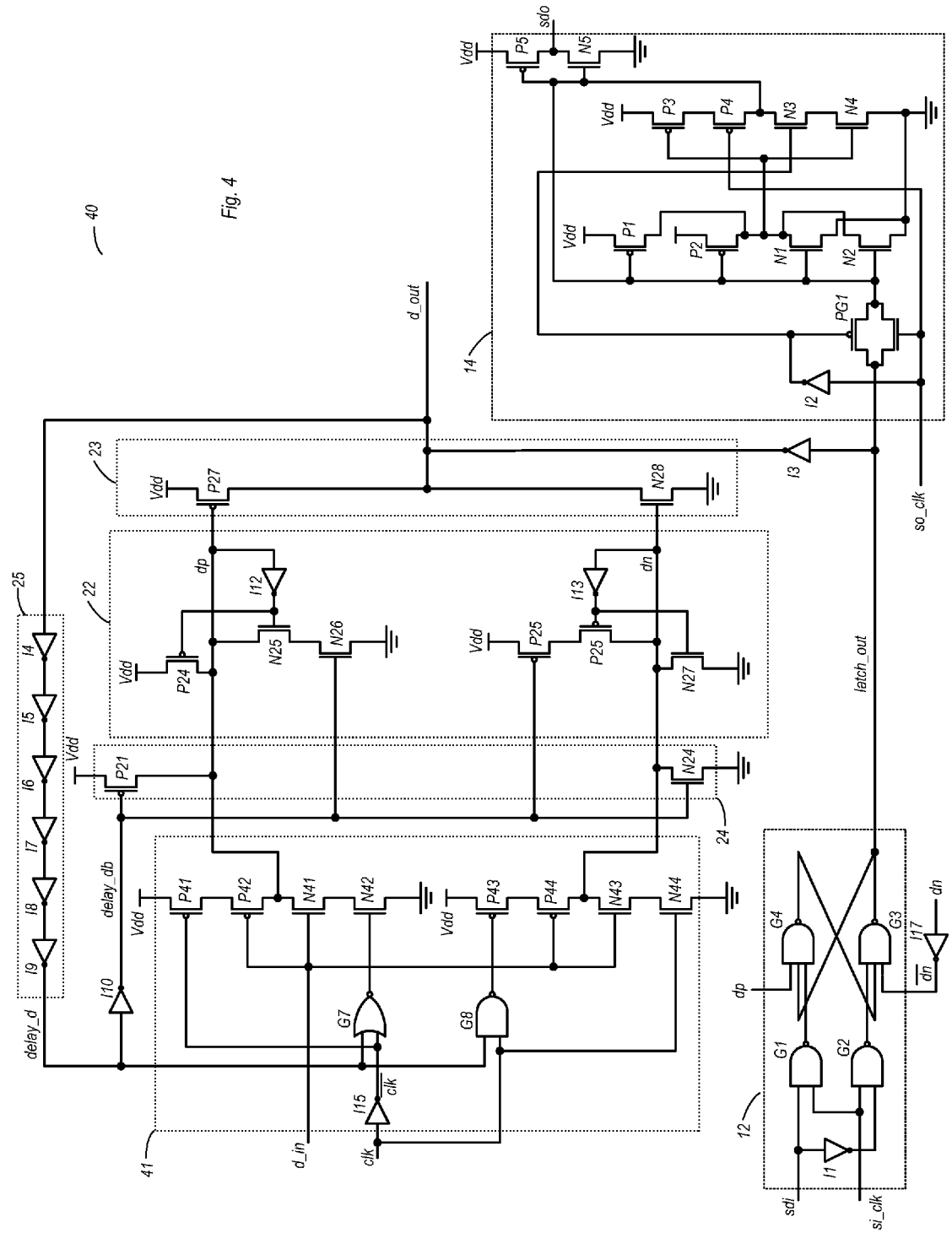
FIG. 4 is a schematic diagram of another embodiment of a repeater latch circuit.

FIG. 4 is a schematic diagram of another embodiment of a repeater latch circuit. Repeater latch 40 in this embodiment includes a static input circuit 41 having two pull-up circuits and two pull-down circuits. This is in contrast to the dynamic input circuits 21 and 31 of the embodiments shown in FIGS. 2 and 3, respectively. Each of the pull-up and pull-down circuits in the embodiment shown is implemented using a two-transistor stack, and may thus avoid the problems of the three-transistor stack discussed above. Input circuit 41 also includes a NOR gate G7 and a NAND gate G8. Operation of input circuit 41 may be similar to that of input circuit 31 of FIG. 3, while differing in certain aspects.

Node dp may be pulled low when a low-to-high transition occurs on d_in when the clock signal is high. NOR gate G7 is arranged in the embodiment shown to output a high (thus causing the activation of transistor N42) when the clock signal is high (and thus its complement is low) and logic value present on delay_d is also low. A pull-down path from node dp to ground is provided when the transistors of the first pull-down circuit, N41 and N42, are active. Transistor P27 activates responsive to the low on node dp, thereby pulling d_out high. Transistor P27 remains active until node dp is again pulled high as a result of the operation of the feedback loop.

In addition to activating the first pull-down circuit of N41 and N42, a high on both the clock input and d_in also results in the activation of a second pull-down circuit that includes transistors N43 and N44. When the second pull-down circuit is active, node dn is pulled low, thereby inhibiting activation of transistor N28.

Node dn may be pulled high when NAND gate G8 outputs a logic low as a result of a high on the clock input and a high on node delay_d. When both node d_in and the output of NAND gate G8 are at logic low levels, the pull-up circuit including transistors P43 and P44 is activated, thereby pulling node dn high and activating transistor N28. Transistor N28 may remain turned on until node dn is pulled low again as a result of the operation of the feedback loop. A second pull-up circuit ay also be activated when the clock is high and node d_in is low. When the clock is high (and thus its complement low), transistor P41 is turned on. Transistor P42 is turned on as a result of a low on d_in. When both of these transistors are active, node dp is pulled high, and thus transistor P27 is inhibited from activation.

Figure 5:
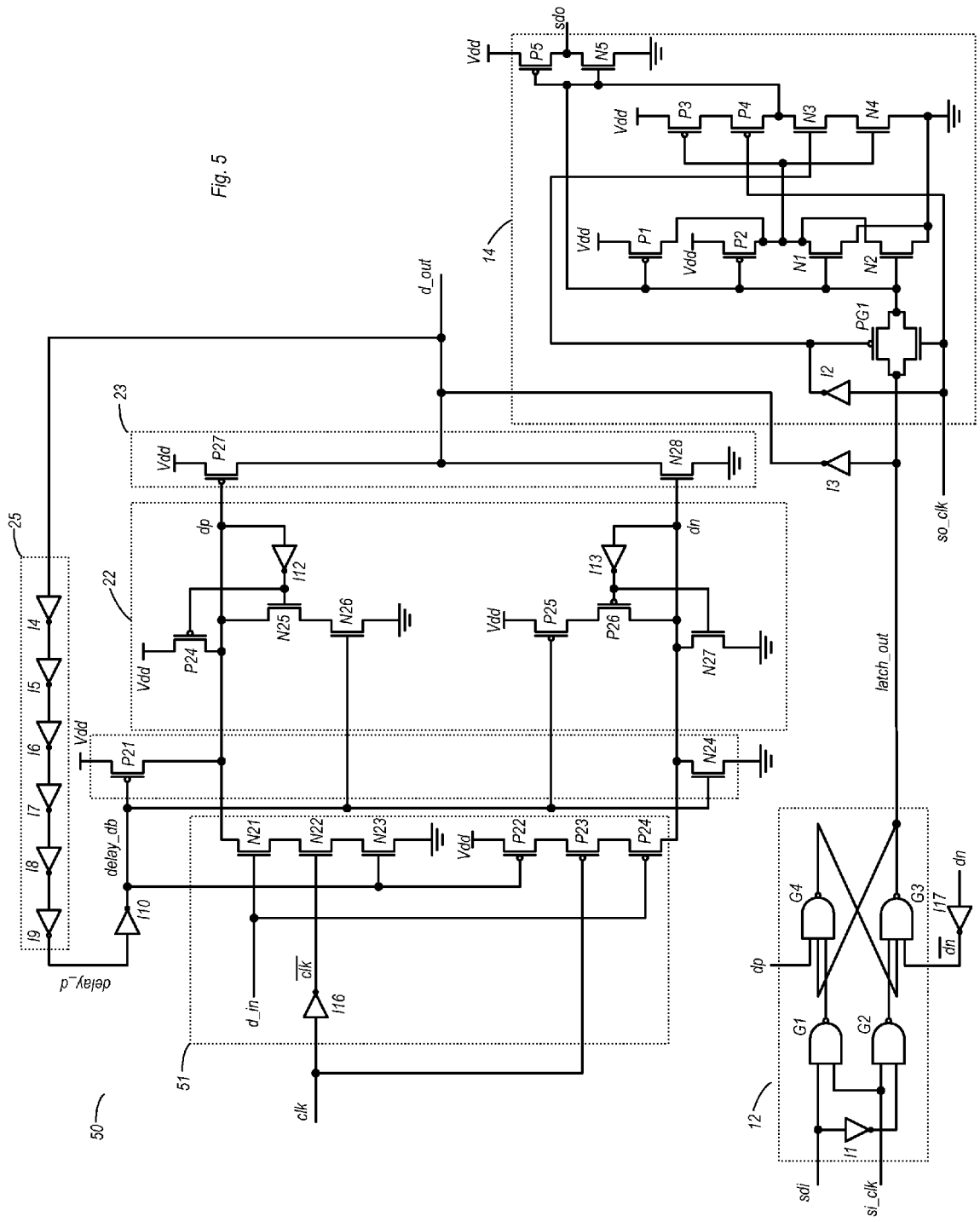
FIG. 5 is a schematic diagram of an embodiment repeater latch circuit that is active when the clock signal is low.

FIG. 5 is a schematic diagram of an embodiment repeater latch circuit that is active when the clock signal is low. In the embodiment shown, repeater latch 50 is similar to repeater latch 20 of FIG. 2. However, in this embodiment, input circuit 51 is arranged such that a logical transition of the output signal is initiated when the clock is low rather than when the clock is high. This is accomplished in this embodiment by providing the clock signal directly to transistor P23 of the pull-up circuit, while the complement of the clock signal is provided to transistor N22 of the pull-down circuit. Thus, when the clock signal is low, both transistors P23 and N22 are activated, and one of a pull-up path or pull-down path may be activated according to the logic levels on nodes d_in and delay_d.

Using repeater latch 50 may be useful in conjunction with one of the other repeater latch circuits of FIGS. 2-4. For example, if repeater latch 50 is coupled in series with a repeater latch that is clock high level sensitive, a signal may be driven for an entire clock cycle, i.e. on both the high and low portions of the clock signal. Such an example will be further discussed below.

Figure 6:
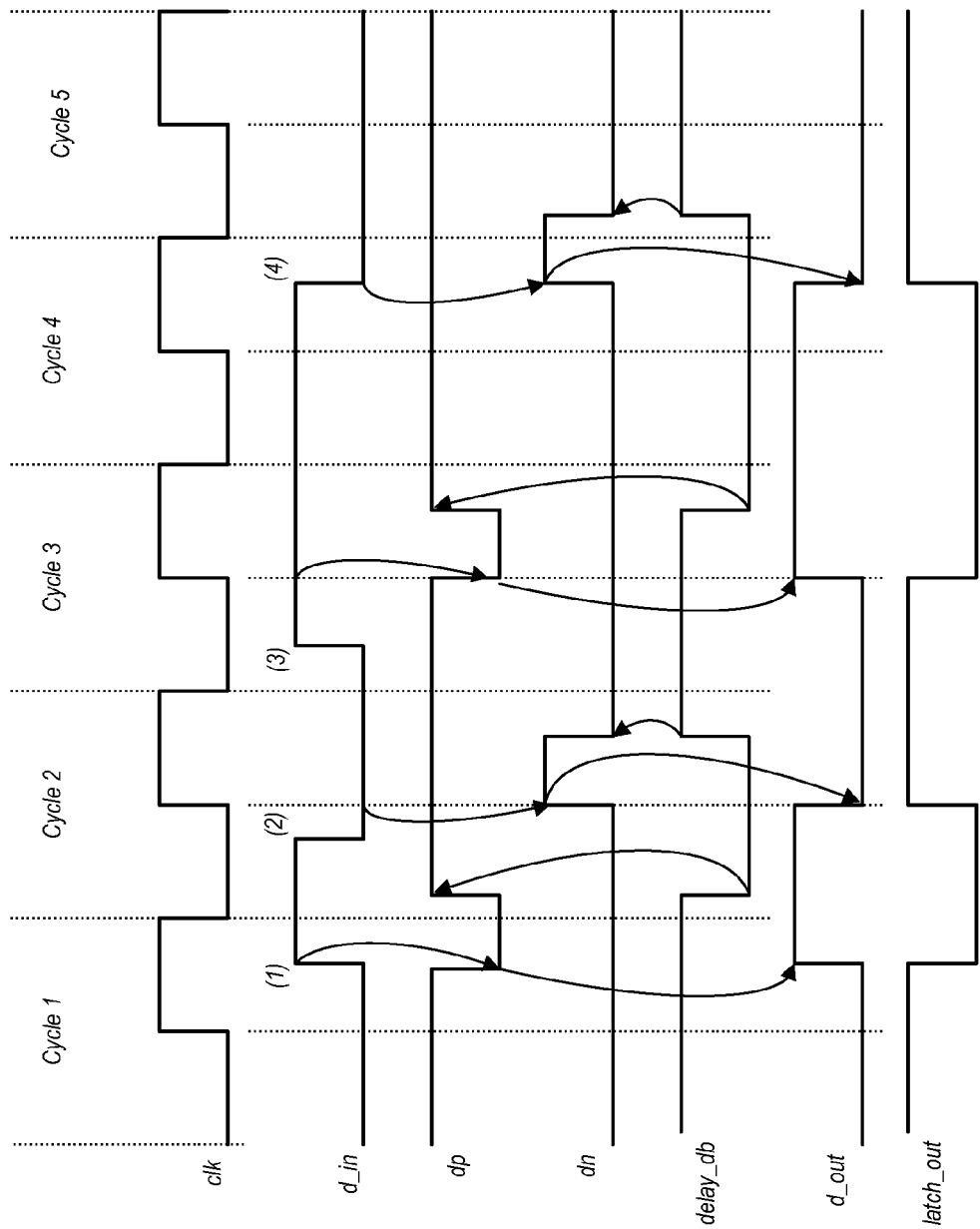
FIG. 6 is a timing diagram illustrating the operation of one embodiment of a repeater latch circuit.

Timing Diagram:

Turning now to FIG. 6, a timing diagram illustrating the operation of one embodiment of a repeater latch circuit is shown. The operation explained illustrated by the timing diagram of FIG. 6 may be applied to repeater latch 20 of FIG. 2, although the operation of the embodiments of FIG. 3 may be largely similar, if not the same.

In the example shown, five clock cycles are shown in order to illustrate various operational scenarios that may occur with repeater latch circuit 20. At the beginning of the example, the signals on clk, d_in, dn, and d_out are low, while the signals on dp, delay_db, and latch_out are high. After the clock signal transitions high in Cycle 1, a low-to-high transition, (1), occurs on d_in. As a result of this transition, node dp falls low, and thus causes d_out to be pulled high. The logic level of latch_out, which is complementary to that of d_out, falls low when d_out is pulled high. Node dp remains low for an amount of time equivalent to the delay provided by delay circuit 25 and inverter I10 coupled between d_out and delay_db. Since the logic value of delay_db is a delayed complement of the logic value of d_out, delay_db falls low at the delay time subsequent to d_out being pulled high. As shown in this example, delay_db does not fall low until after the clock signal has fallen low. Thus, while the initiation of the circuit operation is dependent on a level of the clock signal (e.g., when the clock is high in this particular case), the completion of circuit operation is independent of the clock signal. Node d_out continues to remain high after dp is pulled high due to inverter I3, which receives the low on latch_out and outputs a high to d_out.

Subsequent to the clock signal falling low and beginning Cycle 2, a high-to-low transition, (2), occurs on d_in. Since the clock is low when this transition occurs, and since the example shown in FIG. 6 applies to a circuit that is level sensitive high, there is no immediate change in the state of the circuit. However, once the clock transitions high in Cycle 2, node dn is pulled high as a result of the low on d_in. The high on node dn activates the pull-down device of the output circuit, and thus d_out is pulled low as a result, while latch_out is pulled high. Node dn continues to be pulled low for an amount of time equal to the delay time. Once the effect of the logical transition of d_out propagates through delay circuit 25 and inverter I10, delay_db undergoes a low-to-high transition, and as a result, node dn is pulled low again. Node d_out continues to remain high after node dn falls low again, due to the inversion of the low on latch_out by inverter I3.

During the clock low portion of Cycle 3, another low-to-high transition, (3), occurs on node d_in. Since the clock is still low when this transition takes place, the circuit is not immediately affected, and thus no state changes occur on any of the other circuit nodes. Once the clock transitions high in Cycle 3, node dp is pulled low as a result of the high on d_in, which in turn results in node d_out being pulled high (as a result of the activation of P27) and latch_out being driven low (as a result of the low on node dp being received by latch 12). Node dp continues to be pulled low until when delay_db, the delayed complement of d_out, falls low at the delay time subsequent to the low-to-high transition on d_out. When node dp is pulled high, transistor P27 turns off and thus discontinues driving the high on output node d_out. However, the output node continues to be held high due to the effect of inverter I3 inverting the low on latch_out.

The high on node d_in remains in this example throughout the high portion of Cycle 3 and the low portion of Cycle 4, and at the beginning of the clock high portion of Cycle 4. Since the state of d_out at the beginning of the clock high portion of Cycle 4 (logic high) is equivalent to the state of d_in at this time, no immediate change occurs in the circuit as a result of the low-to-high transition of the clock signal. However, transition (4), a high-to-low transition occurs on d_in during the clock high portion of cycle 4, thereby causing node dn to be pulled high. When node dn is pulled high, transistor N28 is turned on and drives node d_out low. Transistor N28 remains active until dn is pulled low as a result of the low-to-high transition of node delay_db. The low-to-high transition of node delay_db at this point in the example occurs subsequent to the clock signal falling low and the beginning of Cycle 5, thus once again illustrating that completion of the circuit operation is independent of the clock signal. Node d_out continues to be held low after the deactivation of transistor N28 due to the inversion of the high present on latch_out. The low on d_in remains as the clock transitions high in Cycle 5. Thus, no further changes occur in the circuit at this point of the example, as d_out is already low.

Figure 7:
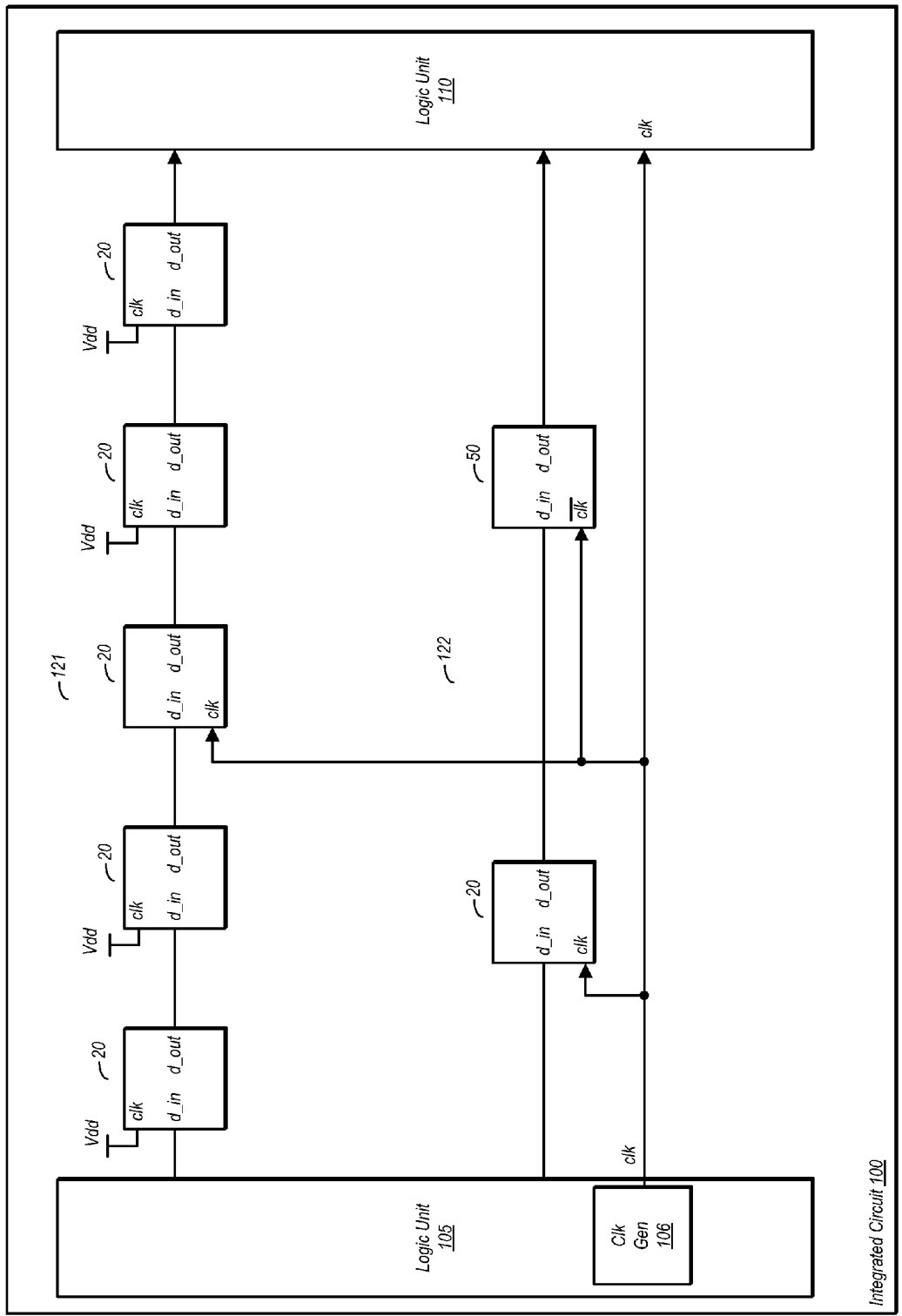
FIG. 7 is a block diagram of one embodiment of an integrated circuit (IC) having a plurality of signal paths coupled between logic units, wherein each of the signal paths includes embodiments of one or more repeater latch circuits.

IC Examples:

FIG. 7 is a block diagram of one embodiment of an integrated circuit (IC) having a plurality of signal paths coupled between logic units, wherein each of the signal paths includes embodiments of one or more repeater latch circuits. In the embodiment shown, IC 100 includes a logic unit 105 coupled to a logic unit 110 by two exemplary signal paths, signal path 121 and signal path 122. Logic unit 105 also includes a clock generator 106, which distributes a clock signal to various portions of IC 100, including logic unit 110.

Due to the relative lengths of the signal paths 121 and 122 and the skew of the clock signal, each utilizes repeater circuits to counteract the negative effects that might otherwise occur in their absence. Signal path 121 utilizes five instances of repeater latch 20 as shown in FIG. 2. It is noted that any of the other embodiments of a repeater latch discussed herein may also be used, as well as any variation thereof. In four of the instances of repeater latch 20 in signal path 121, the clock input is connected directly to the supply voltage node, Vdd. Accordingly, these four instances of repeater latch 20 are always transparent during operation of IC 100. That is, these four instances of repeater latch 20 may respond without delay to a change on their input nodes since they are level sensitive to a clock high state, which is enforced by the direct coupling to Vdd. The middle repeater latch 20 of signal path 121 is coupled to receive the clock signal, and is thus transparent to changes in the state of its respective input signal only when the clock signal is high. Thus, in signal path 121, the middle repeater latch 20 serves as a clocked state element that stores the state of the signal during transition from logic unit 105 to logic unit 110, while the other four instances of repeater latch 20 operate as unclocked repeater circuits that respond without delay to a change in the state of their respective input signals.

Signal path 122 in the embodiment shown includes repeater latch 20 and a repeater latch 50, as shown in FIG. 5. As previously noted, repeater latch 50 is level sensitive to a low clock signal. Thus, repeater latches 20 and 50 of signal path 122 may operate to ensure that a signal transmitted across this signal path may be driven by a repeater latch during the entirety of the clock cycle. Logic unit 105 may drive a signal to the data input d_in of repeater latch 20, which may respond to the state of this signal during the high portion of the clock signal. Repeater latch 20 may drive the output signal at the same state of the input signal on its output node, d_out, with the output signal being received at the input node of repeater latch 50. When the clock falls low, repeater latch 50 may respond by driving the output node at the same state of the received input signal. Thus, the signal being conveyed between logic unit 105 and logic unit 110 may be driven during both the high and low portions of the clock signal.

Figure 8:
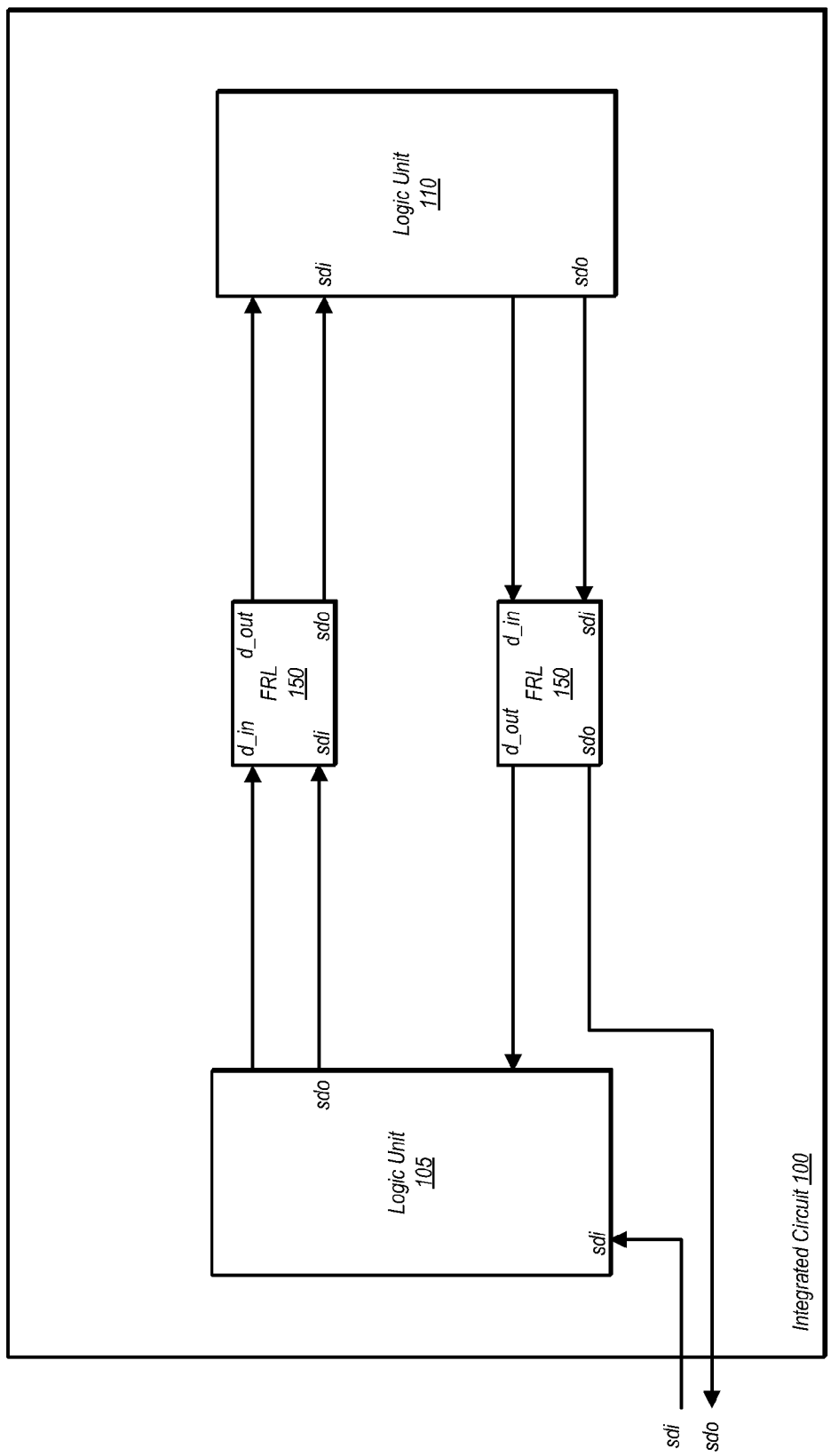
FIG. 8 is a block diagram of one embodiment of an IC having including a plurality of repeater latches coupled in a scan chain.

As previously noted, the various embodiments of a repeater latch discussed above may be utilized for scan testing purposes. FIG. 8 is a block diagram illustrating one embodiment of an IC having including a plurality of repeater latches coupled in a scan chain. In the embodiment shown, IC 100 includes a logic unit 105 and logic unit 110, with fast repeater latches (FRL's) 150 coupled in signal paths between them. FRL's 150 may be any one of the repeater latch embodiments discussed above, as well as variations of such repeater latches. As shown in FIG. 8, each of these elements is coupled to form a scan chain, with a scan data input of one element being coupled to a scan data output of a previous element (save for the first and last scan elements). During scan testing, test stimulus data may be shifted into and through the scan chain via the scan data input of IC 100. After testing is complete, test result data may be shifted through the scan chain via scan data outputs of each element, and from IC 100 through its scan data output. It is noted that the embodiment of IC 100 is exemplary, and that the number of scan elements in a scan chain may vary widely from one IC to the next. It is also noted that the scan input clock and scan output clock connections are not shown in this example for the sake of simplicity, although it is to be understood that such connections are nevertheless present.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
an input circuit coupled to receive a data input signal and a clock signal;
an output circuit coupled to the input circuit, wherein the output circuit is configured to, when activated, drive an output signal on an output node, and wherein the input circuit is configured to, responsive to a logical transition of the input signal, activate the output circuit in order to initiate a logical transition of the data output signal;
a deactivation circuit configured to deactivate the output circuit at a delay time subsequent to activation of the output circuit; and
a latch coupled the output circuit, wherein the latch circuit is configured to change a latch output state responsive to activation of the output circuit, and wherein the latch is further configured to hold a state of the output circuit on the output node subsequent to deactivation of the output circuit;
wherein the input circuit is configured to activate the output circuit dependent on the clock signal, and wherein the deactivation circuit is configured to deactivate the output circuit independent of the clock signal.

2. The circuit as recited in claim 1, wherein the circuit further includes a feedback loop having a delay circuit coupled between the output circuit and the deactivation circuit, wherein the delay circuit is coupled to receive the output signal and is configured to provide a delayed complement of the output signal to each of the input circuits and deactivation circuits.

3. The circuit as recited in claim 2, wherein the deactivation circuit is configured to deactivate the output circuit responsive to receiving the delayed complement of the output signal.

4. The circuit as recited in claim 1, wherein the latch includes a first input coupled to a first node of the output circuit and a second input coupled to a second node of the output circuit, wherein the latch is configured to change the latch output state responsive to the input circuit driving one of the first node or the second node.

5. The circuit as recited in claim 4, wherein the latch includes a scan data input and a first scan clock input coupled to receive a first scan clock signal, wherein the latch is configured to change the latch output sate responsive to a change of state of the scan data input concurrent with a first state of the first scan clock signal.

6. The circuit as recited in claim 5, further comprising a scan output latch having a data input coupled to receive the latch output state, second scan clock input coupled to receive a second scan clock signal, and a scan data output configured to provide a scan data output signal having the same state as the latch output state, wherein the scan output latch is configured to receive the latch output state when the scan output clock is in a first state, and is configured to provide the scan data output signal having the same state as the latch output state when the scan output clock is in a second state.

7. The circuit as recited in claim 1, further comprising a keeper circuit configured to hold the output circuit in an inactive state subsequent to the deactivation circuit deactivating the output circuit, and prior to a subsequent change of state of the data input circuit concurrent with a first state of the clock signal.

8. The circuit as recited in claim 7, wherein the input circuit is configured such that it is inhibited from activating the output circuit during a second state of the clock signal.

9. The circuit as recited in claim 1, wherein the input circuit includes a first pull-down circuit coupled between a first node of the output circuit and a ground node, and a first pull-up circuit coupled between a second node of the output circuit and a voltage supply node, wherein the first pull-down circuit includes a plurality of NMOS (n-channel metal oxide semiconductor) transistors coupled in series, and wherein the first pull-up circuit includes a plurality of PMOS (p-channel metal oxide semiconductor) transistors coupled in series.

10. The circuit as recited in claim 9, further comprising:
a first logic gate coupled to receive a complement of the clock signal and a delayed version of the output signal, and further coupled to provide a first signal to a first NMOS transistor of the first pull-down circuit; and
a second logic gate coupled to receive the clock signal and the delayed version of the output signal, and further coupled to provide a second signal to a first PMOS transistor of the first pull-up circuit.

11. The circuit as recited in claim 10, further comprising a second pull-up circuit coupled between the first node and the voltage supply node, and a second pull-down circuit coupled between the second node and the ground node.

12. A circuit comprising:
an output circuit having a first transistor and a second transistor and configured to drive an output signal onto an output node, wherein the first transistor is configured to drive the output signal when a first node is active, and wherein the second transistor is configured to drive the output signal when a second node is active;
an input circuit coupled to the first node and the second node and further coupled to receive an input signal and a clock signal, wherein the input circuit is configured to activate the first node responsive to first logical transition of the input signal concurrent with a first state of the clock signal, and further configured to activate the second node responsive to a second logical transition of the input signal concurrent with the first state of the clock signal;

a deactivation circuit configured to, independent of the clock signal, deactivate an active one of the first and second nodes at a delay time subsequent to activation of one of the first and second nodes;

a latch having first and second inputs coupled to the first and second nodes, respectively, and configured to change a latch output state responsive to activation of one of the first and second nodes, and wherein the latch is further configured to maintain a state of the output signal subsequent to deactivation of the one of the first and second nodes.

13. The circuit as recited in claim 12, wherein the circuit includes a feedback loop having a delay circuit coupled between the output node and the deactivation circuit, wherein the deactivation circuit is configured to deactivate the active one of the first and second nodes responsive to receiving a delayed complement of the output signal from the delay circuit.

14. The circuit as recited in claim 12, wherein the latch includes a scan data input and a first scan clock input coupled to receive a first scan clock signal, wherein the latch is configured to change the latch output sate responsive to a change of state of the scan data input concurrent with a first state of the first scan clock signal, wherein the latch circuit is further configured to inhibit changes of the latch output state based on the scan data input when the first scan clock signal is in a second state.

15. The circuit as recited in claim 14, further comprising a scan output latch having a data input coupled to receive the latch output state, second scan clock input coupled to receive a second scan clock signal, and a scan data output configured to provide a scan data output signal having the same state as the latch output state, wherein the scan output latch is configured to receive the latch output state when the scan output clock is in a first state, and is configured to provide the scan data output signal at a state complementary to the latch output state when the scan output clock is in a second state.

16. The circuit as recited in claim 12, wherein the input circuit includes a first pull-down circuit coupled between the first node and a ground node, and a first pull-up circuit coupled between the second node and a voltage supply node, wherein the first pull-down circuit includes a plurality of NMOS (n-channel metal oxide semiconductor) transistors coupled in series, and wherein the first pull-up circuit includes a plurality of PMOS (p-channel metal oxide semiconductor) transistors coupled in series, wherein the first pull-down circuit is configured to pull the first node low when each of the plurality of NMOS transistors are active, and wherein the first pull-up circuit is configured to pull the second node high when each of the plurality of PMOS transistors are active.

17. The circuit as recited in claim 16, further comprising:
a first logic gate coupled to receive a complement of the clock signal and a delayed version of the output signal, and further coupled to provide a first signal to a first NMOS transistor of the first pull-down circuit; and
a second logic gate coupled to receive the clock signal and the delayed version of the output signal, and further coupled to provide a second signal to a first PMOS transistor of the first pull-up circuit.

18. The circuit as recited in claim 17, a second pull-up circuit coupled between the first node and the voltage supply node, and a second pull-down circuit coupled between the second node and the ground node.

19. An integrated circuit comprising:
a first logic unit,
a second logic unit,
a signal path coupled between the first logic unit and the second logic unit, wherein the signal path includes one or more repeater circuits, wherein each of the one or more repeater circuits includes:
an output circuit having a first transistor and a second transistor and configured to drive an output signal onto an output node, wherein the first transistor is configured to drive the output signal when a first node is active, and wherein the second transistor is configured to drive the output signal when a second node is active;
an input circuit coupled to the first node and the second node and further coupled to receive an input signal and a clock signal, wherein the input circuit is configured to activate the first node responsive to first logical transition of the input signal concurrent with a first state of the clock signal, and further configured to activate the second node responsive to a second logical transition of the input signal concurrent with the first state of the clock signal;
a deactivation circuit configured to, independent of the clock signal, deactivate an active one of the first and second nodes at a delay time subsequent to activation of one of the first and second nodes;
a latch having first and second inputs coupled to the first and second nodes, respectively, and configured to change a latch output state responsive to activation of one of the first and second nodes, and wherein the latch is further configured to maintain a state of the output signal subsequent to deactivation of the one of the first and second nodes.

20. The integrated circuit as recited in claim 19, wherein the signal path includes a first repeater circuit and a second repeater circuit, wherein the first repeater circuit transparent when the clock signal is high, and wherein the second repeater circuit is transparent when the clock signal is low.

* * * * *

UNITED STATES PATENT AND TRADEMARK OFFICE
CERTIFICATE OF CORRECTION

PATENT NO. : 8,330,588 B2
APPLICATION NO. : 12/759833
DATED : December 11, 2012
INVENTOR(S) : Dixit et al.

Page 1 of 1

It is certified that error appears in the above-identified patent and that said Letters Patent is hereby corrected as shown below:

On Title page, in column 1, item (75) under "Inventors", line 2, delete "Maisleid," and insert -- Masleid, --, therefor.

In column 11, line 9, after "IC" delete "having".

In column 12, line 13, in Claim 5, delete "sate" and insert -- state --, therefor.

In column 13, line 28, in Claim 14, delete "sate" and insert -- state --, therefor.

Signed and Sealed this
Twelfth Day of March, 2013

Teresa Stanek Rea
*Acting Director of the United States Patent and Trademark Office*